(12) United States Patent
Oppelt

(10) Patent No.: US 6,445,219 B1
(45) Date of Patent: Sep. 3, 2002

(54) METHOD AND CIRCUIT CONFIGURATION FOR CONVERTING A FREQUENCY SIGNAL TO A DC VOLTAGE

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/531,194

(22) Filed: Mar. 20, 2000

(51) Int. Cl.[7] ................................................. H03D 3/00
(52) U.S. Cl. ...................... 327/102; 327/164; 327/165; 327/227
(58) Field of Search ................................ 327/227, 102, 327/166, 165, 164, 167, 171; 377/47

(56) References Cited

U.S. PATENT DOCUMENTS

| | | | | |
|---|---|---|---|---|
| 5,144,645 A | * | 9/1992 | Schiffmann | 377/47 |
| 5,357,204 A | * | 10/1994 | Knoll | 328/62 |
| 5,786,718 A | * | 7/1998 | Ruuskanen | 327/166 |

FOREIGN PATENT DOCUMENTS

| | | | | |
|---|---|---|---|---|
| CA | 461784 | 8/1984 | | 315/73 |
| DE | 199 05 077 A1 | 9/1999 | | |

OTHER PUBLICATIONS

"Better Linearity For Frequency–To–Voltage–Converters" (Oppelt), dated Jun. 14, 1999, Electronic Design, 2 pages;.

"Integrierte Digitalschaltungen LOCMOS–Reihe HEF 4000 B 1983", Valvo Datenbuch, pp. 551–556, dated May 1983 and Oct. 1980, pertains to built in digital circuits.

CMOS—Taschenbuch Band 1, Standard–Bausteine, 12. Auflage, 3 pages, pertains to standard–modules.

"Monoflops zur Frequenzstabilisation spannungsgesteuerter Oszillatoren" (Oppelt), dated Feb. 1988, UKW–Berichte, pp. 98–105, pertains to monostable multivibrator to stabilize the frequence, as mentioned on p. 1 of the specification.

\* cited by examiner

*Primary Examiner*—Tuan T. Lam
*Assistant Examiner*—Hiep Nguyen
(74) *Attorney, Agent, or Firm*—Laurence A. Greenberg; Werner H. Stemer; Gregory L. Mayback

(57) ABSTRACT

In the process for converting a frequency signal to a DC voltage according to the invention a first and a second output voltage signal (UA1, UA2) are generated from the frequency signal. Each of the output voltage signals is a sequence of rectangular pulses the pulse sequence frequency of which is equal to a frequency f of the frequency signal. These are converted with a first and a second lowpass filter to a first DC voltage signal and a second DC voltage signal, respectively, with the second DC voltage signal being used to influence the pulse width T0 of the rectangular pulses of at least the first output voltage signal. This makes it possible to build a simple frequency-to-voltage converter using cost-effective standard monoflops in which a largely linear correlation between frequency f of the frequency signal and the magnitude of the first DC voltage signal is realized in a simple manner.

9 Claims, 4 Drawing Sheets

| Frequency f (kHz) | Output voltage signal UG1 [V] | Linearity error [%] | Output voltage signal UG1 [V] without compensation | Linearity error [%] |
|---|---|---|---|---|
| 100 | 1.000 | 0 | 1.000 | 0 |
| 200 | 2.0001 | +0.005 | 1.991 | −0.45 |
| 300 | 2.9997 | −0.010 | 2.972 | −0.93 |
| 400 | 3.9976 | −0.060 | 3.943 | −1.43 |
| 500 | 5.0004 | +0.008 | 4.908 | −1.84 |

FIG 3

METHOD AND CIRCUIT CONFIGURATION FOR CONVERTING A FREQUENCY SIGNAL TO A DC VOLTAGE

BACKGROUND OF THE INVENTION

Field of the Invention

The invention relates to a process and a circuit configuration for converting a frequency signal to a DC voltage.

To convert a frequency signal to an electrical DC voltage it has become known, for example, from *UKW-Berichte* 2/88, pp. 98–105, to use a monostable trigger circuit (univibrator, monostable multivibrator, or monoflop). Upon a trigger event, such a monostable trigger circuit supplies as an output signal a one-time rectangular pulse, the width or time duration T0 of which can be predefined by an external RC element. If a frequency signal, i.e., a voltage signal periodically oscillating between two values, such as a periodic rectangular signal of frequency f=1/T, is applied to the trigger input of the monostable trigger circuit, then rectangular pulses of the duration To and a period T are created at the output of the monostable trigger circuit as long as the frequency of the frequency signal is less than 1/T0.

A lowpass filter is connected in series with the output of the monostable trigger circuit. The cutoff frequency $f_g$ of the lowpass filter is much lower than frequency f of the frequency signal. A DC voltage signal is obtained at the output of the lowpass filter, the magnitude of which corresponds to the average time value of the rectangular pulse sequence present at the output of the monostable trigger circuit. Since the pulse duration T0 of the rectangular pulses is constant, the magnitude of the DC voltage signal is proportional to the frequency of the frequency signal.

Such a circuit configuration, which is, known as a frequency-to-voltage converter, can be used, for example, as a tachometer generator (tacho-alternator) or as an EM demodulator. Preferably, such a circuit configuration is used for frequency stabilization of tunable oscillators.

In has been shown in practical applications that the magnitude or the value of the DC voltage signal is not exactly proportional to the frequency of the frequency signal. In other words, the relationship between the magnitude of the DC voltage signal and the frequency is not precisely linear. This is caused, for example, by transfer processes that have not been fully completed so that with increasing frequency of the frequency signal the magnitude of the DC voltage signal is always slightly smaller than it would have to be in the case of exact linearity. In a tunable oscillator, for example, this causes frequency deviations or reading errors on the generally linear scale.

Frequency-to-voltage converter ICs with relatively good linearity are known, such as IC AD650 by Analog Devices. These devices, however, require high internal circuit complexity and are therefore substantially more expensive than standard monoflops of the digital CMOS or TTL series. The price difference may be as high as a factor of 100. Furthermore, those known frequency-to-voltage converter ICs are suitable only for an input frequency of up to approximately 1 MHz. In contrast, a conventional TTL standard monoflop of Type SN74123, for example, can generate rectangular pulses with a minimum duration T0 of up to about 40 ns at the output. Thus, in principle, it would be possible with this standard monoflop to process frequency signals of up to about 20 MHz.

SUMMARY OF THE INVENTION

It is accordingly an object of the invention to provide a process for converting a frequency signal to a DC voltage, which overcomes the above-mentioned disadvantages of the heretofore-known devices and methods of this general type and which permits, with little circuit complexity, an improved linear correlation between the frequency of the frequency signal and the value of the DC voltage signal even when simple standard monoflops are used. It is a further object of the invention to provide a circuit configuration to implement the novel process.

With the foregoing and other objects in view there is provided, in accordance with the invention, a method of converting a frequency signal to a DC voltage signal, which comprises:

inputting a frequency signal having a given frequency;

generating a first and a second output voltage signal from the frequency signal, each formed of a series of rectangular pulses with a pulse sequence frequency equal to the given frequency (f) of the frequency signal and a pulse width;

converting the first output voltage signal with a first lowpass filter to a first DC voltage signal, and converting the second output voltage signals with a second lowpass filter to a second DC voltage signal; and influencing with the second DC voltage signal a pulse width of the rectangular pulses of at least the first output voltage signal.

In other words, in the process for converting a frequency signal to a DC voltage, a first and second output voltage signal are generated from the frequency signal, each of which consists of a sequence of rectangular pulses, the pulse sequence frequency (the period) of which is equal to the frequency of the frequency signal. With a first respectively a second lowpass filter, the first and second output voltage signal are converted to a first respectively a second DC voltage signal. The second DC voltage signal is used to influence the pulse width of the rectangular pulse of at least the first output voltage signal.

As a consequence, it is possible to change the magnitude or value of the first DC voltage signal as a function of the frequency of the frequency signal and to compensate linearity errors. For example, if the pulse width is increased, the magnitude of the first DC voltage signal available at the output of the first lowpass filter also increases while the frequency remains constant. This makes it possible to compensate a linearity error with negative sign occurring at constant pulse width, i.e., the value of the uncompensated DC voltage signal would correspond to a smaller frequency than would be the case with exact linearity. Depending on the sign of the linearity error, the pulse width of the first output voltage signal is thus either increased or decreased.

In accordance with an added feature of the invention, the second output voltage signal is generated by inverting the first output voltage signal. The first DC voltage signal and the second DC voltage signal are thus opposed to each other. With the use of common monoflop ICs, this permits particularly simple compensation of the linearity error, which in this case is typically negative. In this case, the second DC voltage signal also influences the pulse width of the second output voltage signal, since the first and second output voltage signals are merely inverted with respect to each other.

With the above and other objects in view there is also provided, in accordance with the invention, a circuit configuration for converting a frequency signal to a DC voltage, comprising:

a circuit having an input receiving a frequency signal having a given frequency, an output outputting a first output voltage signal and a second output voltage signal, and a control input, the circuit generating the first and second output voltage signals from the frequency signal each with a sequence of rectangular pulses having a pulse sequence frequency equal to the given frequency of the frequency signal;

a first lowpass filter connected to the output for converting the first output voltage signal to a first voltage signal; and a second lowpass filter connected to the output for converting the second output voltage signal to a second voltage signal, and connected to the control input of the circuit for determining a pulse width T0 of the rectangular pulses of the first output voltage signal.

In accordance with another feature of the invention, the circuit is a monostable trigger circuit. This permits the use of cost-effective standard monoflops of the CMOS or TTL series.

In accordance with a further feature of the invention, the second output voltage signal is inverted relative to the first output voltage signal. This permits particularly simple compensation of the linearity error, which is typically negative in standard monoflops.

In accordance with again an added feature of the invention, the monostable trigger circuit has a first output for outputting the first output voltage signal and a second output for outputting the second output voltage signal. The two output signals of the monostable trigger circuit are thereby inverted relative to one another.

In accordance with a concomitant feature of the invention, an ohmic feedback resistor is connected between the output of the second lowpass filter and the control input of the monostable trigger circuit. The value of the ohmic feedback resistor must be selected such that the linearity error becomes as small as possible within the designated output voltage range.

Other features which are considered as characteristic for the invention are set forth in the appended claims.

Although the invention is illustrated and described herein as embodied in process and circuit configuration for converting a frequency signal to a DC voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a table showing the value of the first output voltage signal as a function of the frequency of the frequency signal in a circuit according to the invention as depicted in FIG. 2 (cols. 2, 3) and in a circuit based on the prior art (cols. 4, 5)

DESCRIPTION OF THE PREFERRED EMBODIMENTS

Figure 1:
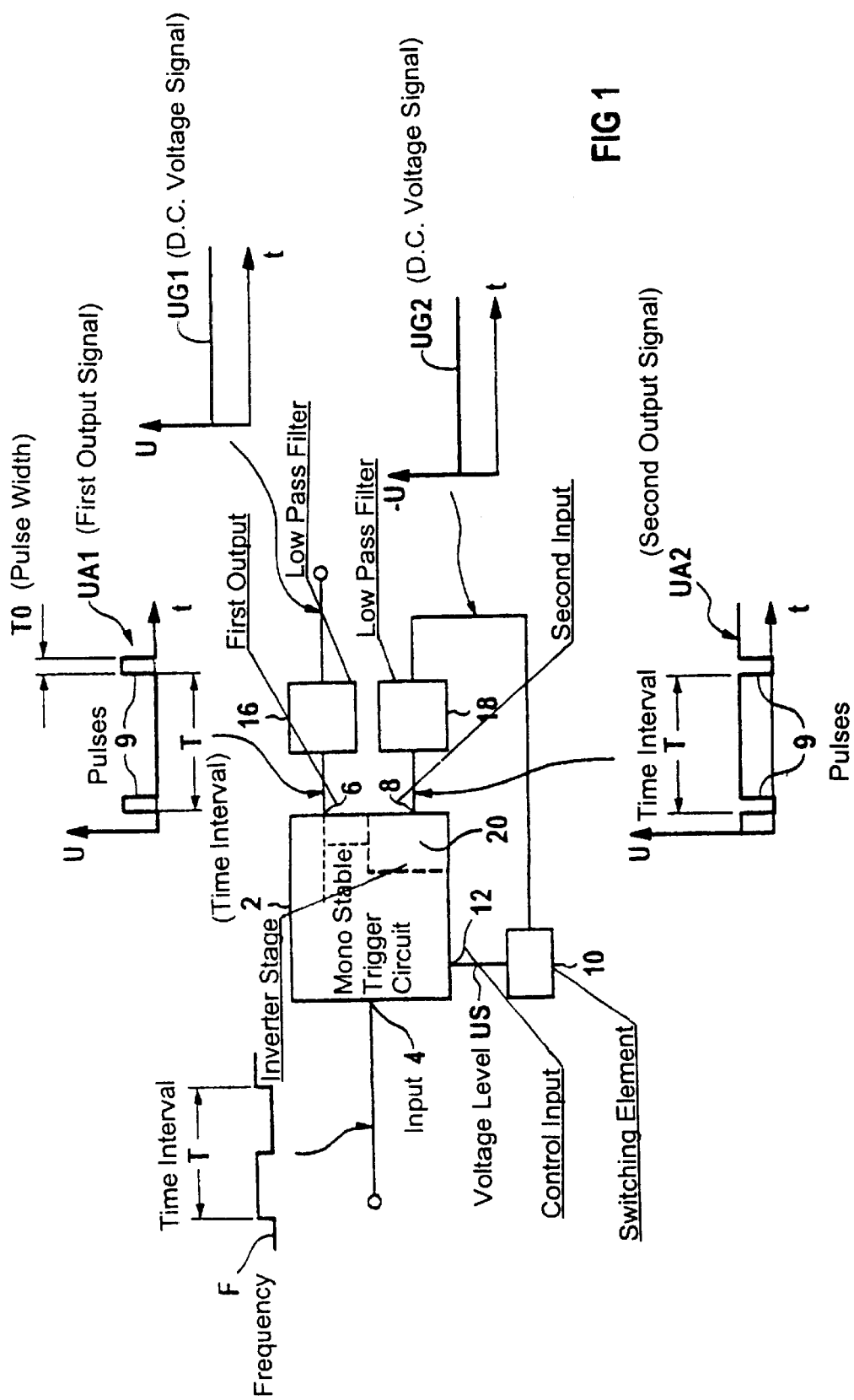
FIG. 1 a schematic block circuit diagram of a circuit configuration according to the invention.

Referring now to the figures of the drawing in detail and first, particularly, to FIG. 1 thereof, the circuit configuration comprises a circuit 2 with an input 4 for a frequency signal F, a first output 6 for a first output voltage signal UA1, and a second output 8 for a second output voltage signal UA2.

The circuit 2 is a monostable trigger circuit that generates from frequency signal F for each positive or negative edge on the first and second output 6, 8 short rectangular voltage pulses or rectangular pulses 9, which make up the output voltage signals UA1 and UA2. In the exemplary embodiment, the pulse width T0 of this voltage pulse is determined by an external switching element 10 that is connected to a control input 12 of the circuit 2.

The first output voltage signal UA1 is composed of a sequence of short rectangular pulses, the interval of which corresponds to period T of frequency signal F. The second output voltage signal UA2 is inverted relative to the first output voltage signal UA1 and thus is also composed of a sequence of short rectangular pulses of the opposite sign. The interval of the pulses of UA2 also corresponds to period T.

A first lowpass filter 16 is connected in series with the first output 6 and a second lowpass filter 18 is connected in series with the second output 8. The respective cutoff frequencies $f_{g1}$ and $f_{g2}$ of the lowpass filters 16 and 18 are much smaller than the frequency f=1/T of the frequency signal F. At the output of the first lowpass filter 16, a first DC voltage signal UG1 is thus available, the value of which depends on the number of rectangular pulses of the first output voltage signal UA1 per unit of time and their pulse width T0. Likewise, at the output of the second lowpass filter 18, a second DC voltage signal UG2 is available, the value of which also depends on the number of rectangular pulses of the second output voltage signal UA2 per unit of time and their pulse width T0.

In the exemplary embodiment, the second output voltage signal UA2 is produced by inverting the first output voltage signal UA1 by means of an inverter stage 20 that is disposed internally within the circuit 2. The first output 6 and the second output 8 of circuit 2 in this case are also referred to as Q or $\overline{Q}$ output. As an alternative, an external inverter stage connected to the output 6 may also be provided.

The output of the second lowpass filter 18 is connected via the switching element 10 (determining pulse width T0) to the control input 12 of the circuit 2 and influences the average voltage level US available at the control input 12 and determining the pulse width T0.

If, for example, the value of the first DC voltage signal UG1 with increasing frequency f, with a second lowpass filter 18 that is not connected to the switching element, i.e., without compensation, is smaller than the ideal value that would result from exact linearity, the voltage level US is influenced by means of the second DC voltage signal UG2, such that the pulse width T0 slightly increases to compensate the linearity error.

In case of deviation from linearity with a different sign, pulse width T0 is correspondingly reduced.

Figure 2:
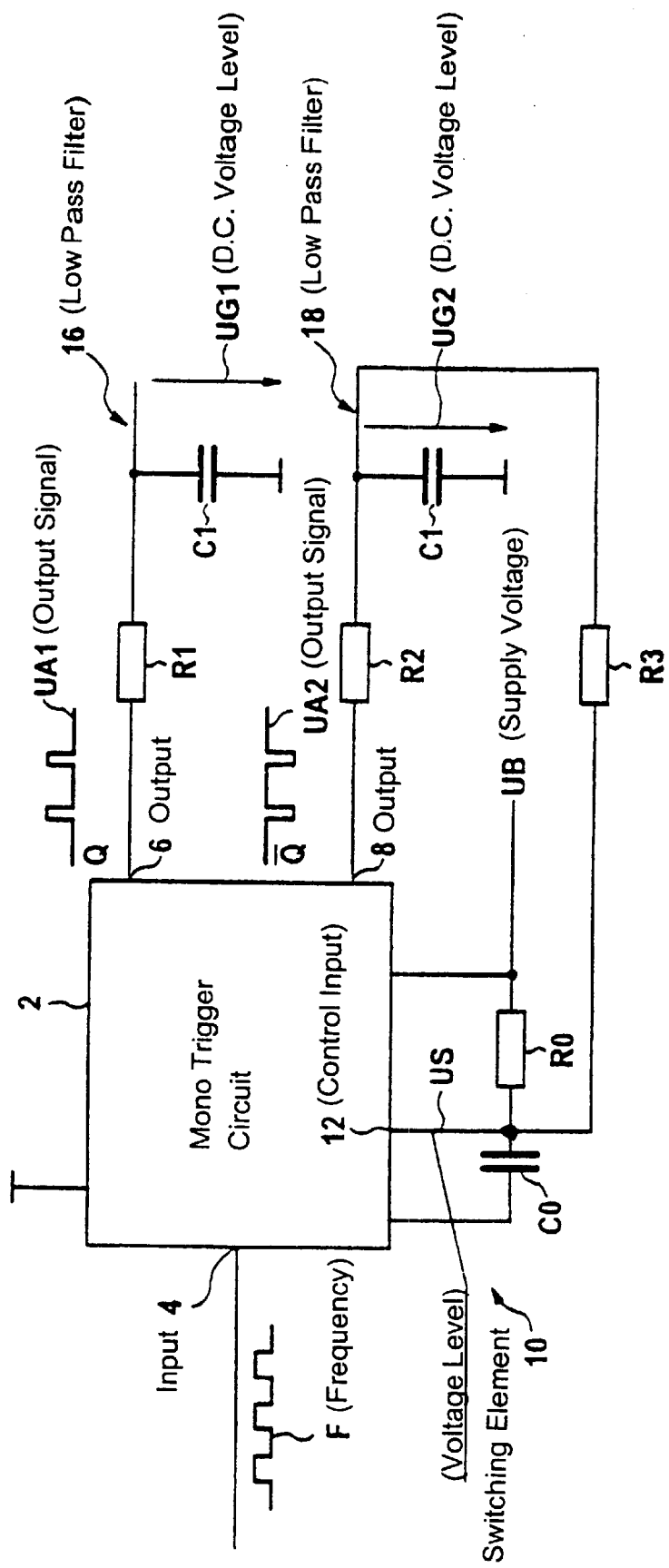
FIG. 2 is a schematic of an exemplary embodiment of the invention with a CMOS standard monoflop Type 4528 as the circuit.
Figure 4:
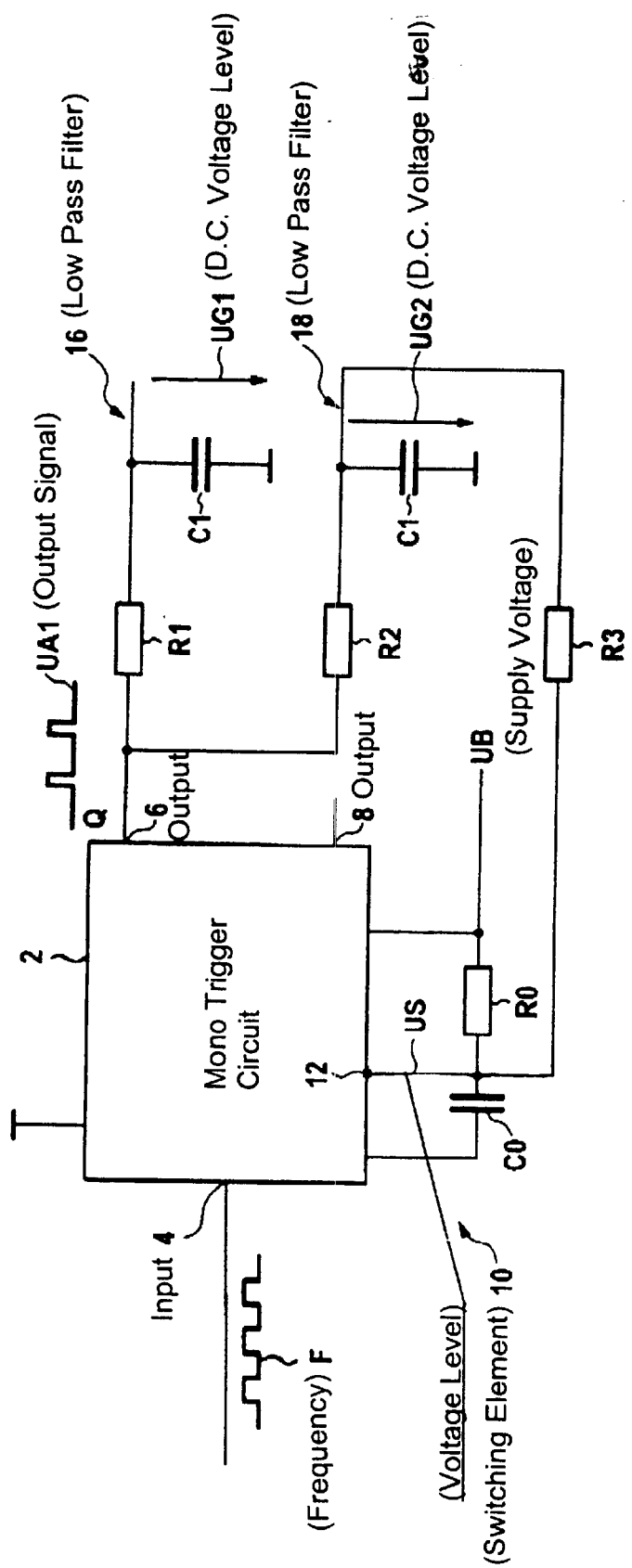
FIG. 4 is a schematic of an exemplary embodiment of the invention with a CMOS standard monoflop Type 4528 as the circuit, where a second lowpass filter may be coupled to a first output.

The exemplary embodiment according to FIG. 2 shows the circuit for a CMOS standard monoflop Type 4528 by Philips. The first lowpass filter 16 comprises a RC element with a resistance R1=30 kΩ and a capacitance C1 of 0.1 μF. The second lowpass filter 18 also comprises a RC element whose resistance R2 equals resistance R1 (R1=R2) and whose capacitance C2 equals capacitance C1 (C1=C2) of the first lowpass filter 16. The output of the second lowpass filter 18 is connected via a feedback resistor R3, in the exemplary embodiment 680 kΩ, to the control input 12 that determines the pulse width T0 (the so-called RC input) of the circuit 2. The external switching element 10 also comprises an RC member whose resistance R0 is 10 kΩ and whose capacitance C0 is 220 pF.

The pulse width T0 of the first and second output voltage signals UA1 and UA2 adjusted by RC elements R0 and C0 of switching element 10, is then approximately 1.9 μs. Thus, this circuit can process frequency signal frequencies f of up to approximately 520 kHz.

The circuit 2 is furthermore connected by additional inputs to a supply voltage UB=5 V and to ground.

The value of the second DC voltage signal UG2 available at the output of the second lowpass filter 18 is UB−UG1 and is thus opposed to the value of the first DC voltage signal UG1. This slightly reduces the voltage level US at the control input 12.

In the IC family of the exemplary embodiment, this causes pulse width T0 to increase, so that the value of the first DC voltage signal UG1 is slightly higher than it would be without feedback of the second DC voltage signal UG2. The feedback must be adapted to the respective monoflop used by suitable dimensioning of the feedback resistor R3.

It will be understood that if, in another IC family, the average potential at the control input has an opposite influence on pulse width T0, or if DC voltage signal UG1 is overproportionate to frequency f, the second lowpass filter 18 is also to be connected to the first output 6 and the feedback resistor R3 is to be dimensioned accordingly.

The table shown in FIG. 3 compares the value of output voltage signal UA1 normalized to a frequency of 100 kHz for different frequencies f of the frequency signal F with the associated percentage linearity errors for the circuit according to FIG. 2 and for a circuit without a second lowpass filter 18 and without a feedback resistor R3. The table shows that the maximum linearity error in a circuit based on the prior art is −1.84% and can be reduced with minimum complexity by the circuit according to the invention to a maximum value of approximately −0.06%.

I claim:

1. A method of converting a frequency signal to a DC voltage signal, which comprises:

inputting a frequency signal having a given frequency;

generating a first and a second output voltage signal from the frequency signal, each formed of a series of pulses with a pulse sequence frequency equal to the given frequency of the frequency signal and a pulse width;

converting the first output voltage signal with a first lowpass filter to a first DC voltage signal, and converting the second output voltage signal with a second lowpass filter to a second DC voltage signal; and influencing the pulse width of the pulses of at least the first output voltage signal only with the second DC voltage signal.

2. The method according to claim 1, wherein the step of generating the second output voltage signal comprises inverting the first output voltage signal.

3. A circuit configuration for converting a frequency signal to a DC voltage signal, comprising:

a circuit having an input receiving a frequency signal having a given frequency, a first output outputting a first output voltage signal and a second output outputting a second output voltage signal, and a control input, said circuit generating the first and second output voltage signals from the frequency signal each with a sequence of pulses having a pulse sequence frequency equal to the given frequency of the frequency signal;

a first lowpass filter connected to said first output for converting the first output voltage signal to a first DC voltage signal, and a second lowpass filter connected to said second output for converting the second output voltage signal to a second DC voltage signal, said control input of said circuit being only connected to said second lowpass filter for determining a pulse width of the pulses of the first output voltage signal.

4. The circuit configuration according to claim 3, wherein the second output voltage signal is inverted relative to the first output voltage signal.

5. The circuit configuration according to claim 3, wherein said circuit is a monostable trigger circuit.

6. The circuit configuration according to claim 5, which comprises an ohmic feedback resistor connecting an output of said second lowpass filter to said control input of said monostable trigger circuit.

7. A circuit configuration for converting a frequency signal to a DC voltage signal, comprising:

a circuit having an input receiving a frequency signal having a given frequency, an output outputting an output voltage signal, and a control input, said circuit generating the output voltage signal from the frequency signal with a sequence of pulses having a pulse sequence frequency equal to the given frequency of the frequency signal;

a first lowpass filter connected to said output for converting the output voltage signal to a first DC voltage signal, and a second lowpass filter connected to the output for converting the output voltage signal to a second DC voltage signal, said control input of said circuit being only connected to said second lowpass filter for determining a pulse width of the pulses of the output voltage signal.

8. The circuit configuration according to claim 7, wherein said circuit is a monostable trigger circuit.

9. The circuit configuration according to claim 7, which further comprises an ohmic feedback resistor connecting an output of said second lowpass filter to said control input of said monostable trigger circuit.

* * * * *